(12) United States Patent
Zhang

(10) Patent No.: US 10,748,817 B2
(45) Date of Patent: Aug. 18, 2020

(54) SEMICONDUCTOR DEVICE AND FABRICATION METHOD THEREOF

(71) Applicants: Semiconductor Manufacturing International (Shanghai) Corporation, Shanghai (CN); SMIC New Technology Research and Development (Shanghai) Corporation, Shanghai (CN)

(72) Inventor: Cheng Long Zhang, Shanghai (CN)

(73) Assignees: Semiconductor Manufacturing International (Shanghai) Corporation, Shanghai (CN); SMIC New Technology Research and Development (Shanghai) Corporation, Shanghai (CN)

( * ) Notice: Subject to any disclaimer, the term of this patent is extended or adjusted under 35 U.S.C. 154(b) by 0 days.

(21) Appl. No.: 16/200,930

(22) Filed: Nov. 27, 2018

(65) Prior Publication Data

US 2019/0172754 A1    Jun. 6, 2019

(30) Foreign Application Priority Data

Dec. 6, 2017    (CN) .......................... 2017 1 1275236

(51) Int. Cl.
   *H01L 21/8234*    (2006.01)
   *H01L 21/02*       (2006.01)
   *H01L 21/3105*    (2006.01)
   *H01L 21/311*     (2006.01)
   (Continued)

(52) U.S. Cl.
   CPC ............. *H01L 21/823481* (2013.01); *H01L 21/02164* (2013.01); *H01L 21/02271* (2013.01); *H01L 21/02337* (2013.01); *H01L 21/31053* (2013.01); *H01L 21/31111* (2013.01); *H01L 21/31144* (2013.01); *H01L 21/76224* (2013.01); *H01L 21/823431* (2013.01); *H01L 29/6681* (2013.01)

(58) Field of Classification Search
   CPC ....... H01L 21/823481; H01L 21/02164; H01L 21/02271; H01L 21/02337; H01L 21/31053; H01L 21/31111; H01L 21/31144; H01L 21/76224; H01L 21/823431; H01L 29/6681
   See application file for complete search history.

(56) References Cited

U.S. PATENT DOCUMENTS 9,425,108 B1 *  8/2016  Pranatharthiharan ....................... H01L 21/02164
9,607,985 B1 *  3/2017  Tseng ................. H01L 27/0886
9,754,798 B1 *  9/2017  Bi ....................... H01L 29/0649
(Continued)

*Primary Examiner* — Nathan W Ha
(74) *Attorney, Agent, or Firm* — Anova Law Group, PLLC

(57) ABSTRACT

A fabrication method for a semiconductor device is provided. The method includes: forming a semiconductor substrate including a first region and a second region; forming intrinsic fins protruding from the first region of the semiconductor substrate, and dummy fins protruding from the second region of the semiconductor substrate; forming a first isolation layer to cover a portion of sidewalls of the dummy fins and a portion of sidewalls of the intrinsic fins; forming a protection layer on surfaces of the intrinsic fins, to cover a portion of the intrinsic fins above a surface of the first isolation layer; removing the dummy fins and a portion of the first isolation layer in the second region; and forming a second isolation layer on the second region of the semiconductor substrate.

19 Claims, 6 Drawing Sheets

(51) Int. Cl.
    *H01L 21/762*     (2006.01)
    *H01L 29/66*     (2006.01)

(56) References Cited

U.S. PATENT DOCUMENTS

| | | | |
|---|---|---|---|
| 9,899,372 B1* | 2/2018 | Bi | H01L 21/308 |
| 10,068,810 B1* | 9/2018 | Wu | H01L 21/3088 |
| 2015/0206759 A1* | 7/2015 | Tsao | H01L 29/0653 |
| | | | 257/506 |
| 2015/0340289 A1* | 11/2015 | Park | H01L 21/823431 |
| | | | 438/424 |
| 2016/0260636 A1* | 9/2016 | Lin | H01L 21/823412 |
| 2017/0069539 A1* | 3/2017 | Li | H01L 21/823493 |
| 2017/0213767 A1* | 7/2017 | Sung | H01L 21/823431 |
| 2018/0076225 A1* | 3/2018 | Bergendahl | H01L 29/66545 |
| 2018/0108754 A1* | 4/2018 | Anderson | H01L 29/6681 |
| 2018/0337101 A1* | 11/2018 | Zhou | H01L 21/76229 |

* cited by examiner

SEMICONDUCTOR DEVICE AND FABRICATION METHOD THEREOF

CROSS-REFERENCES TO RELATED APPLICATION

This application claims the priority of Chinese Patent Application No. 201711275236.6, filed on Dec. 6, 2017, the content of which is incorporated herein by reference in its entirety.

TECHNICAL FIELD

The present disclosure generally relates to the field of semiconductor technologies and, more particularly, relates to a semiconductor device and its fabrication method.

BACKGROUND

A metal-oxide-semiconductor (MOS) transistor is one of the most important components in modern integrated circuits. A MOS transistor usually includes: a semiconductor substrate, gate structures on the semiconductor substrate; and source/drain doped regions in the semiconductor substrate on sides of each gate structure. Each gate structure usually includes a gate dielectric layer on the semiconductor substrate and a gate electrode layer on the gate dielectric layer.

As semiconductor technologies continuously develop, a control ability of a conventional planar MOS transistor on channel currents becomes weaker, resulting in serious leakage current effects. A fin field effect transistors (FinFETs) is a kind of new multi-gate device. A FinFET usually includes: fins protruding from the semiconductor substrate; gate structures covering a part of top surfaces of the fins and a part of sidewalls of the fins; and source/drain doped regions in the fins on sides of each gate structure.

However, semiconductor devices made from the FinFETs have poor performances.

SUMMARY

One aspect of the present disclosure provides a fabrication method of a semiconductor device. The method includes: forming a semiconductor substrate including a first region and a second region adjacent to each other; forming intrinsic fins protruding from the first region of the semiconductor substrate, and dummy fins protruding from the second region of the semiconductor substrate; forming a first isolation layer on the first region and on the second region of the semiconductor substrate, to cover a portion of sidewalls of the dummy fins and a portion of sidewalls of the intrinsic fins; forming a protection layer on surfaces of the intrinsic fins, to cover a portion of the intrinsic fins above a surface of the first isolation layer; removing the dummy fins and a portion of the first isolation layer in the second region; and forming a second isolation layer on the second region of the semiconductor substrate after removing the dummy fins and the portion of the first isolation layer in the second region, and forming the protection layer.

Another aspect of the present disclosure provides a semiconductor device. The semiconductor device includes: a semiconductor substrate including a first region and a second region, wherein the second region is adjacent to the first region; intrinsic fins protruding from the first region of the semiconductor substrate; a first isolation layer on the first region of the semiconductor substrate and covering a portion of sidewalls of the intrinsic fins; a second isolation layer on the second region of the semiconductor substrate; and a protection layer on the first region of the semiconductor substrate and covering a portion of the intrinsic fins above the first isolation layer.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
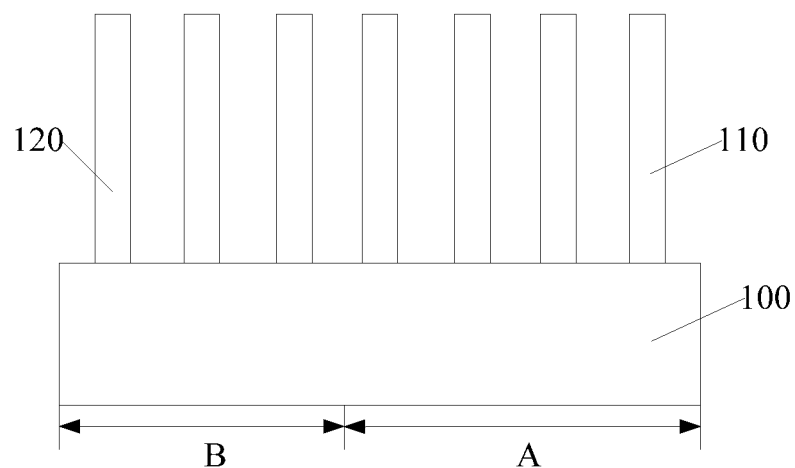
FIG. 1 to FIG. 3 illustrate semiconductor structures corresponding to certain stages for forming a semiconductor device.
Figure 2:
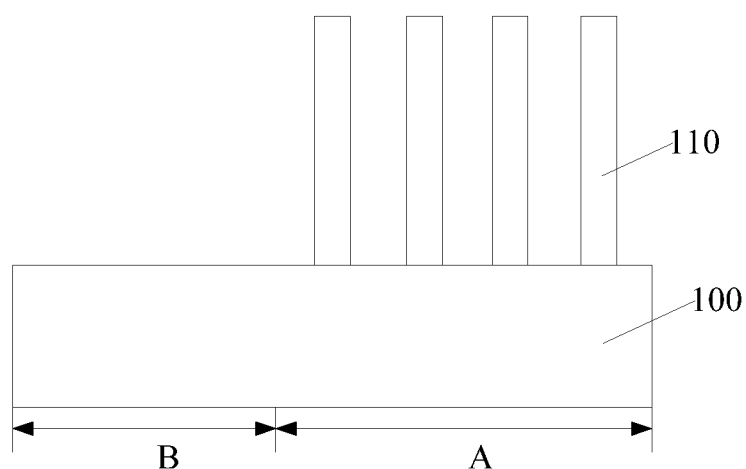
Figure 3:
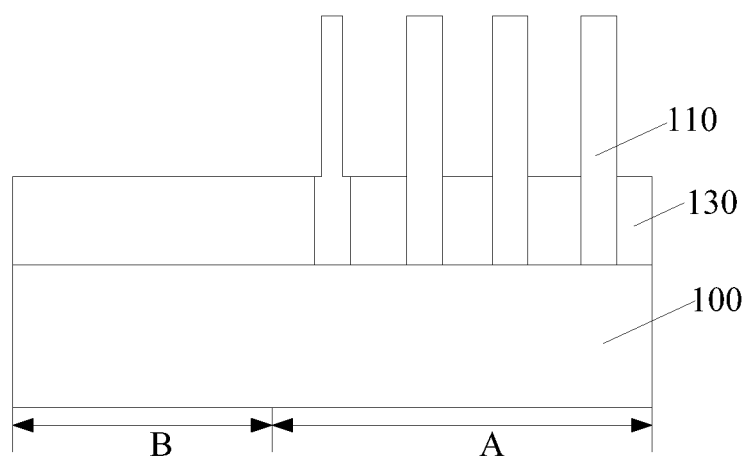

FIGS. 1-3 illustrate semiconductor structures corresponding to certain stages for forming a semiconductor device.

Referring to FIG. 1, a semiconductor substrate 100 is provided. The semiconductor substrate 100 includes a first region A and a second region B, adjacent to each other. Intrinsic fins 110 and dummy fins 120 are formed on the semiconductor substrate 100. The intrinsic fins 110 are on the first region A of the semiconductor substrate 100 and the dummy fins 120 are on the second region B of the semiconductor substrate 100.

Referring to FIG. 2, the dummy fins 120 are removed.

Referring to FIG. 3, after removing the dummy fins 120, an isolating layer 130 is formed on the first region A and on the second region B of the semiconductor substrate 100, to cover a portion of sidewalls of the intrinsic fins 110.

The isolating layer 130 is formed by: forming an isolating film on the first region A and on the second region B of the semiconductor substrate 100 by a fluid chemical vapor deposition method; and etching-back the isolating film to form the isolating layer 130. The isolating film formed by the fluid chemical vapor deposition method has a good filling performance.

The method further includes forming gate structures crossing the intrinsic fins and forming source/drain doped regions in the intrinsic fins on sides of each gate structure.

However, the semiconductor device formed by the above method has a poor performance. The process for forming the isolating film by the fluid chemical vapor deposition method includes forming an isolating fluid film on the first region A and on the second region B of the semiconductor substrate 100 (not shown in the figures) and annealing the isolating fluid film by a water vapor to form the isolating film.

The annealing of the isolating fluid film by the water vapor uses a gas including oxygen, such as oxygen, ozone, and/or vapor water. In the annealing, the gas including oxygen diffuses into the isolating fluid film, and a part of the gas including oxygen in the isolating fluid film diffuses into the intrinsic fins 110 to oxidize surfaces of the intrinsic fins 110. A width of the intrinsic fins is reduced.

The intrinsic fins 110 in a border of the first region A close to the second region B may be edge fins. After removing the dummy fins 120, the isolating fluid film is formed on the second region B, and a side of each edge fin is covered by the isolating fluid film in the second region B. Correspondingly, in the water vapor annealing process, a large amount of the gas including oxygen in the isolating fluid film of the second region B can diffuse into sidewalls of the edge fins. The edge fins have a large oxidizing consumption and have a small width which cannot meet design needs.

The source/drain doped regions are formed by an epitaxial growth process and is based on the material of the intrinsic fins 110. Because the edge fins have a small width, the source/drain doped regions in the edge fins have small volumes and low performances. For example, a strain of the source/drain doped regions in the edge fins on channels is reduced and carriers in the channels of the edge fins have a too small mobility.

The present disclosure provides a fabricating method for forming a semiconductor device. The method may include: forming intrinsic fins on a first region and dummy fins on a second region, on a semiconductor substrate; forming a first isolating layer on the first region and on the second region of the semiconductor substrate, to cover a portion of sidewalls of the dummy fins and a portion of sidewalls of the intrinsic fins; forming a protective layer on surfaces of the intrinsic fins to cover a portion of the intrinsic fins higher than a surface of the first isolating layer; and after removing the dummy fins and a portion of the first isolating layer on the second region, and forming the protection layer, forming a second isolating layer on the second region of the semiconductor substrate. A performance of the formed semiconductor device may be improved.

Figure 10:
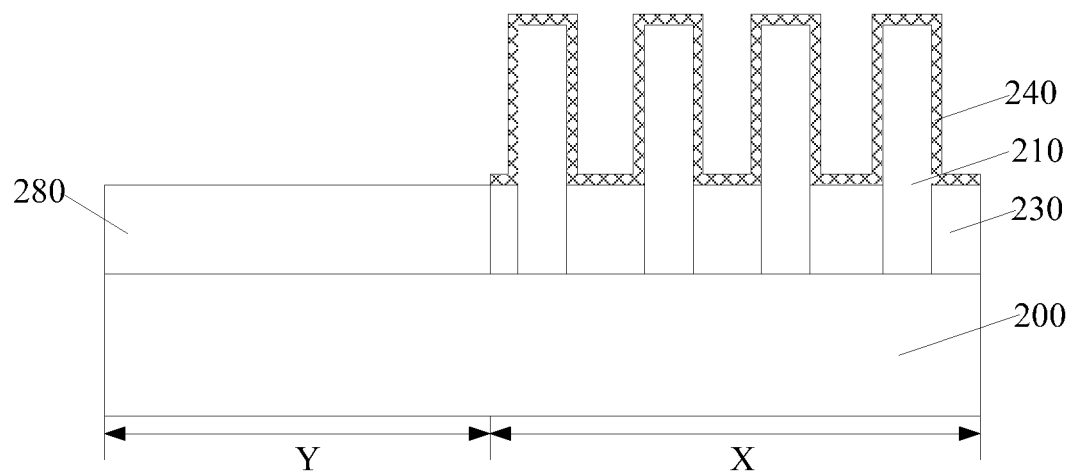
Figure 11:
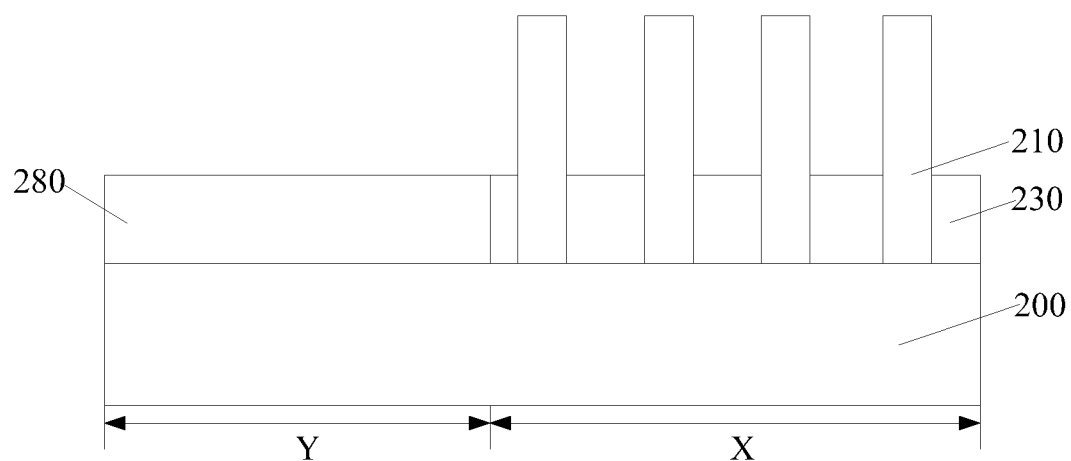
Figure 12:
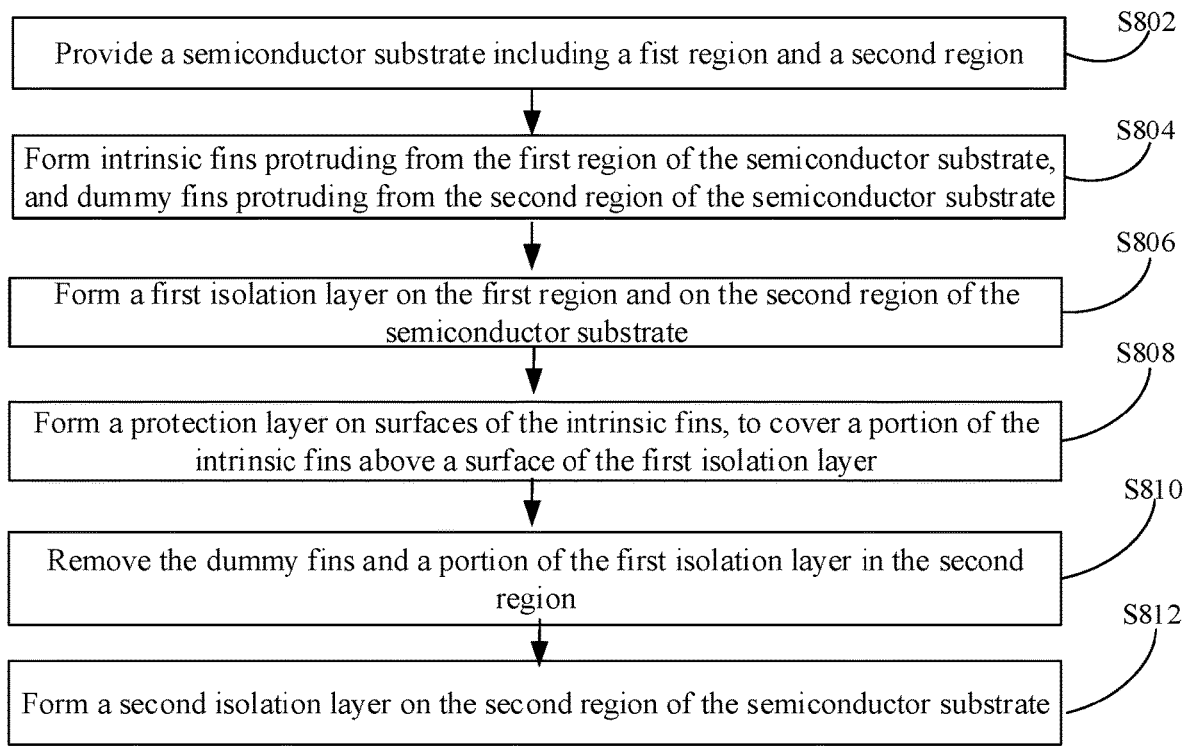
FIG. 12 illustrates an exemplary method for forming a semiconductor device according to various disclosed embodiments of the present disclosure.

FIGS. 4-11 illustrate semiconductor structures corresponding to certain stages for forming an exemplary semiconductor device according to various disclosed embodiments of the present disclosure; and FIG. 12 illustrates an exemplary method for forming a semiconductor device according to various disclosed embodiments of the present disclosure.

Figure 4:
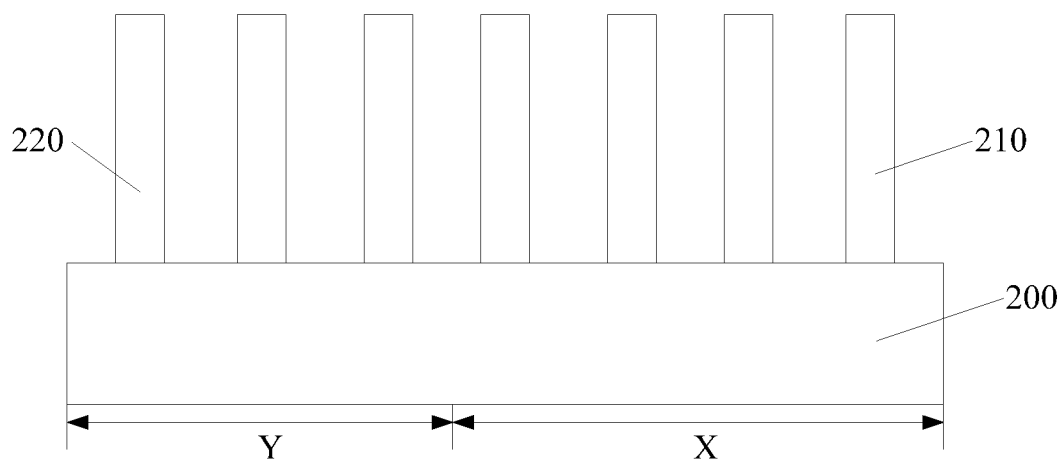
FIGS. 4-11 illustrate semiconductor structures corresponding to certain stages for forming an exemplary semiconductor device according to various disclosed embodiments of the present disclosure.

Referring to FIG. 4, a semiconductor substrate 200 may be provided (i.e. Step S802 in FIG. 12). The semiconductor substrate 200 may include a first region X and a second region Y adjacent to each other.

The semiconductor substrate 200 may be made of single crystalline silicon, polysilicon, and/or amorphous silicon. The semiconductor substrate 200 may be made of a semiconductor material including silicon, germanium, and/or SiGe. In one embodiment, the semiconductor substrate 200 may be made of single crystalline silicon.

In one embodiment, the semiconductor substrate 200 may include the first region X and the second region Y. Subsequently, dummy fins in the second region Y may be removed and only intrinsic fins in the first region X may be preserved.

Referring to FIG. 4, intrinsic fins 210 and dummy fins 220 may be formed on the semiconductor substrate (i.e. Step S804 in FIG. 12). The intrinsic fins 210 may be formed in the first region X of the semiconductor substrate 200 and the dummy fins 220 may be formed in the second region Y of the semiconductor substrate 200.

In one embodiment, the intrinsic fins 210 and the dummy fins 220 may be formed by a double patterning process.

In one embodiment, the intrinsic fins 210 and the dummy fins 200 may be made of single crystalline silicon or single crystalline SiGe. In other embodiments, the intrinsic fins 210 and the dummy fins 200 may be made of other semiconductor materials.

Figure 5:
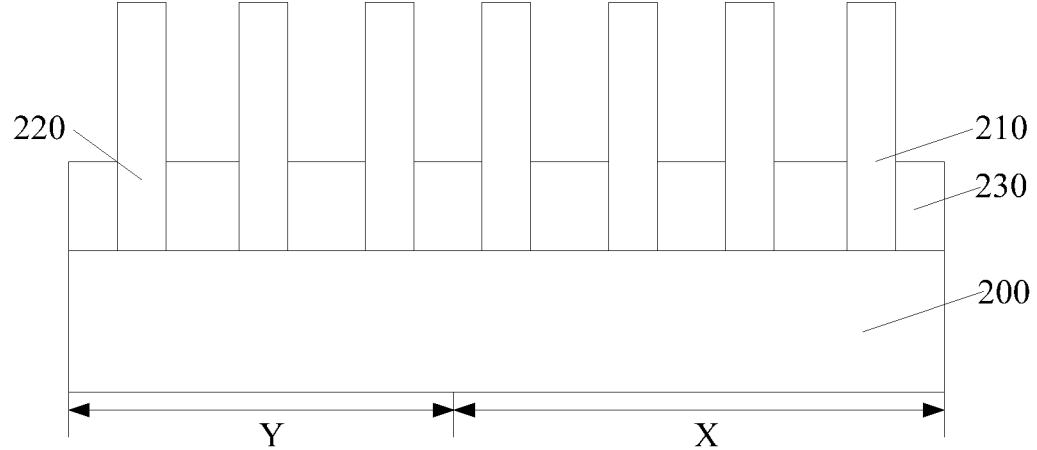

Referring to FIG. 5, a first isolation layer 230 may be formed on the first region X and on the second region Y of the semiconductor substrate, to cover a portion of sidewalls of the dummy fins 220 and a portion of sidewalls of the intrinsic fins 210 (i.e. Step S806 in FIG. 12).

The first isolation layer 230 may be made of a material including $SiO_2$.

The first isolation layer 230 may be formed by: forming a first isolation film on the semiconductor substrate 200, on the intrinsic fins 210 and on the dummy fins 220; removing a part of the first isolation film on the dummy fins 220 and on the intrinsic fins 210 by planarizing; and etching-back the first isolation film after planarizing the first isolation film, to form the first isolation layer 230.

The first isolation film may be formed by a deposition method including a fluid chemical vapor deposition method.

In one embodiment, the first isolation film formed by the fluid chemical vapor deposition method may have a good filling performance.

The first isolation film may be formed by: forming a first isolation fluid layer on the semiconductor substrate 200, on the intrinsic fins 210 and on the dummy fins 220; and performing a first water-vapor annealing process on the first isolation fluid layer to form the first isolation film.

The first water-vapor annealing process may be performed with: a gas including oxygen, ozone, and water vapor; an annealing temperature of about 350° C. to about 750° C.

Figure 6:
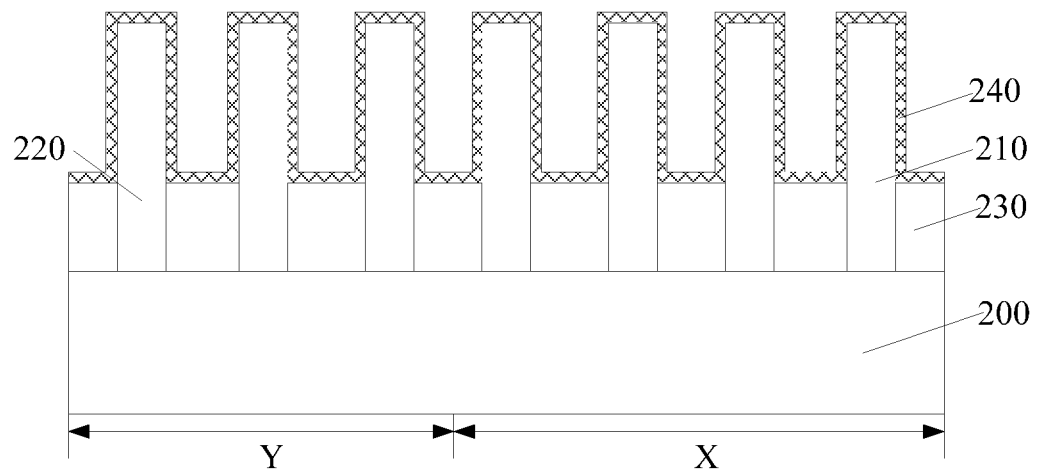

Referring to FIG. 6, a protective layer 240 may be formed on surfaces of the intrinsic fins 210 (i.e. Step S808 in FIG. 12). A portion of the intrinsic fins 210 higher than a surface of the first isolation layer 230 may be covered by the protective layer 240.

In one embodiment, the protective layer 240 may be formed after forming the first isolation layer 230. The protective layer 240 may be formed on a portion of surfaces of the intrinsic fins 210 exposed by the first isolation layer 230 and on the surface of the first isolation layer 230 in the first region X. Correspondingly, the protective layer 240 may cover a portion of the intrinsic fins 210 higher than the surface of the first isolation layer 230, and cover the surface of the first isolation layer 230 in the first region X.

In one embodiment, the protective layer 240 may be formed after forming the first isolation layer 230 but before removing the dummy fins 220 and a portion of the first isolation layer 230 in the second region Y. Correspondingly, the protective layer 240 may cover a portion of the intrinsic fins 210 higher than the surface of the first isolation layer 230, the surface of the first isolation layer 230 in the first region X, a portion of the dummy fins 220 higher than the surface of the first isolation layer 230, and the surface of the first isolation layer 230 in the second region Y.

In some other embodiments, the protective layer 240 may be formed after forming the first isolation layer 230 and after removing the dummy fins 220 and a portion of the first isolation layer 230 in the second region Y. Correspondingly, the protective layer 240 may cover a portion of the intrinsic fins 210 higher than the surface of the first isolation layer 230, and cover the surface of the first isolation layer 230 in the first region X.

In some other embodiments, the protective layer 240 may be formed before forming the first isolation layer 230. Correspondingly, the protective layer 240 may cover all surfaces of the intrinsic fins 210. After forming the first isolation layer 230, the protective layer 240 may be located between the first isolation layer 230 and the intrinsic fins 210. The protective layer 240 may also cover all surfaces of the dummy fins 220. After forming the first isolation layer 230, the protective layer 240 may be located between the first isolation layer 230 and the dummy fins 220.

When forming the protective layer 240 before forming the first isolation layer 230, a damage of the process for forming the first isolation layer 230 on the intrinsic fins 210 may be avoided.

The protective layer 240 may be made of a material including $SiN_x$, and may be formed by a deposition method such as an atomic layer deposition method.

In one embodiment, when forming the protective layer 240 by the atomic layer deposition method, a thickness of the protective layer 240 may have a high uniformity, and a status that the thickness of a portion of the protective layer 240 on surfaces of sidewalls of the intrinsic fins 210 is smaller than the thickness of a portion of the protective layer 240 on top surfaces of the intrinsic fins 210 may be avoided. A protective capability of the protective layer 240 on the sidewalls of the intrinsic fins 210 may be improved.

The protective layer 240 may have a thickness of about 2 nm to about 10 nm. If the thickness of the protective layer 240 is too small, the protective capability of the protective layer 240 on the sidewalls of the intrinsic fins 210 may be not enough when forming a second isolation film. If the thickness of the protective layer 240 is too large, a distance between the protective layer 240 on the sidewalls of the intrinsic fins 210 and the protective layer 240 on the sidewalls of the dummy fins 220 may be too small, and it may be hard to remove the protective layer 240 on a bottom of the sidewalls of the dummy fins 200.

The dummy fins and the portion of the first isolation layer in the second region may be removed subsequently (i.e. Step S810 in FIG. 12).

In one embodiment, a portion of the protective layer 240 in the second region Y may be removed when removing the dummy fins 220 and the portion of the first isolation layer 240 in the second region Y.

Figure 7:
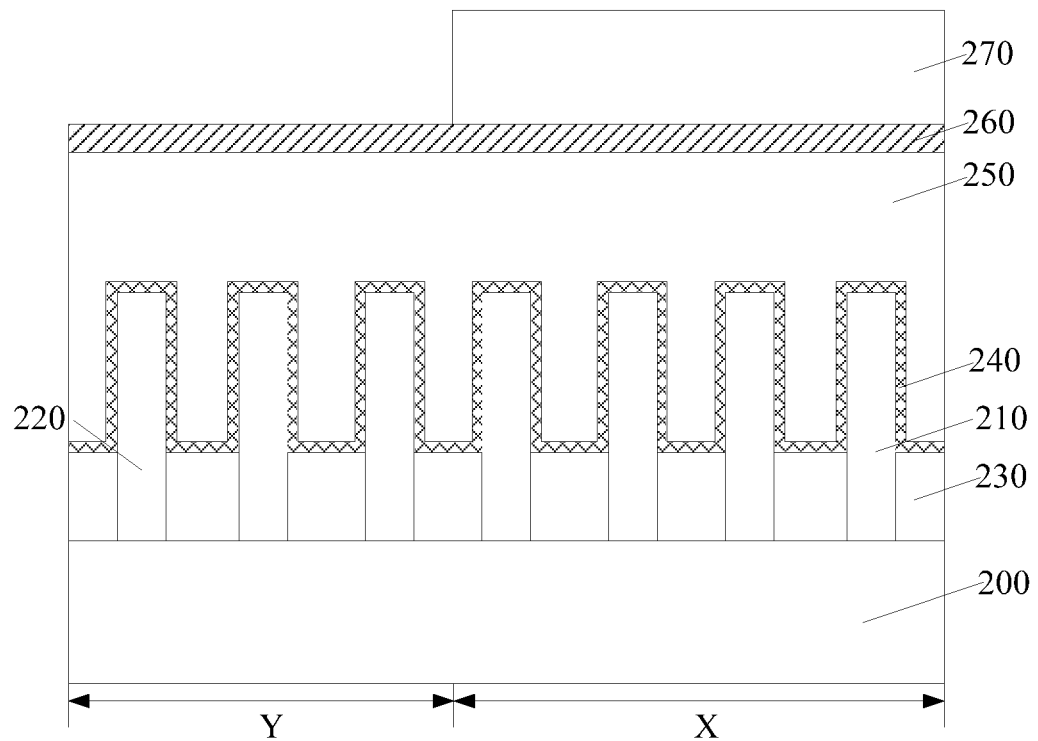

Referring to FIG. 7, a planarizing layer 250 may be formed on the first isolation layer 230, on the dummy fins 220, on the intrinsic fins 210, and on the protective layer 240. The planarizing layer 250 may have a surface higher than the top surfaces of the intrinsic fins 210 and the top surfaces of the dummy fins 220. Subsequently, a bottom anti-reflective layer 260 may be formed on the surface of the planarizing layer 250, and a patterned photoresist layer 270 may be formed on a surface of the bottom anti-reflective layer 260.

The patterned photoresist layer 270 may cover a first portion of the bottom anti-reflective layer 260 in the first region X, but expose a second portion of the bottom anti-reflective layer 260 in the second region Y.

Figure 8:
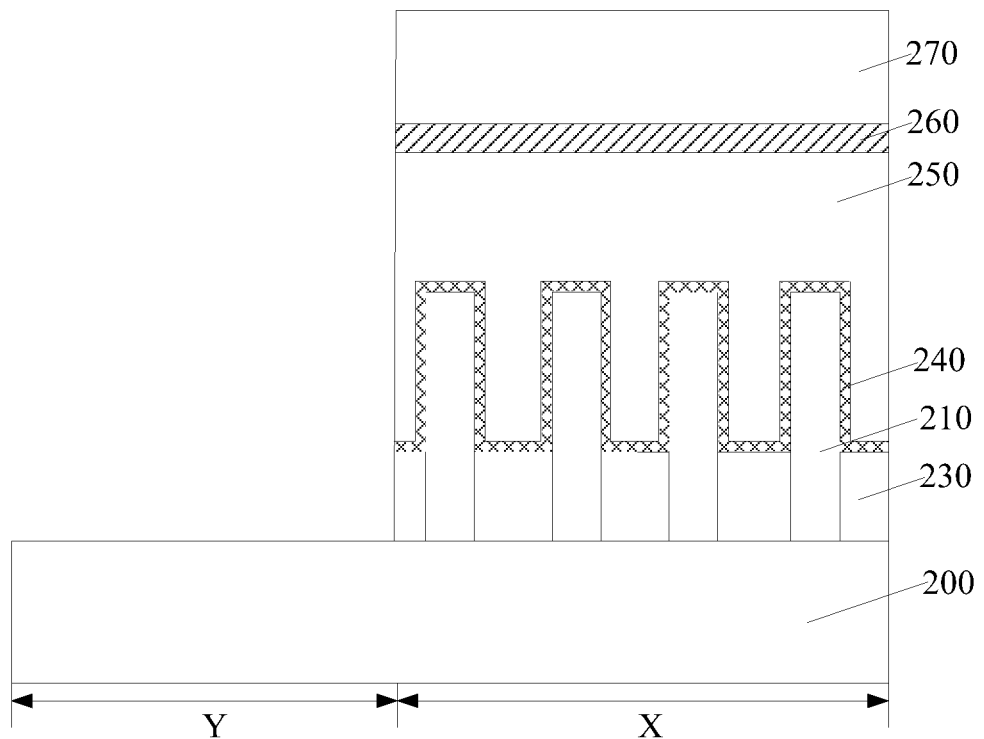

Referring to FIG. 8, the bottom anti-reflective layer 260, the planarizing layer 250, dummy fins 200, and the first isolation layer 230 in the second region Y, may be etched by using the patterned photoresist layer 270 as a mask, to expose the top surface of the semiconductor substrate 200 in the second region Y.

The bottom anti-reflective layer 260, the planarizing layer 250, dummy fins 200, and the first isolation layer 230 in the second region Y, may be etched by an anisotropic dry etching process.

Figure 9:
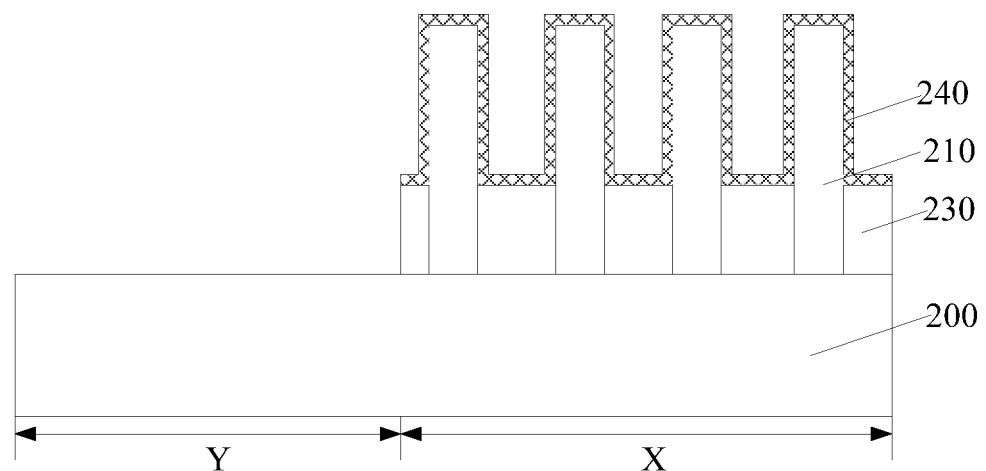

Referring to FIG. 9, the bottom anti-reflective layer 260, the planarizing layer 250, and the patterned photoresist layer 270 may be removed, after etching the bottom anti-reflective layer 260, the planarizing layer 250, dummy fins 200, and the first isolation layer 230 in the second region Y.

In other embodiments, the protective layer may be formed after removing the dummy fins and the first isolation layer in the second region.

Referring to FIG. 10, a second isolation layer 280 may be formed on the second region Y of the semiconductor substrate 200, before forming the protective layer 240 but after removing the dummy fins 220 and a portion of the first isolation layer 230 in the second region Y (i.e. Step S812 in FIG. 12).

The second isolation layer 280 may be made of a material including $SiO_2$.

The second isolation layer 280 may be formed by: forming a second isolation film on the second region Y of the semiconductor substrate 200 and on the protective layer 240; and etching-back the second isolation film to remove a portion of the second isolation film on the protective layer 240 and to form the second isolation layer 280 from the remaining second isolation film on the second region Y of the semiconductor substrate 200.

The second isolation film may be formed by: forming a second isolation fluid layer on the second region Y of the semiconductor substrate 200, and on the protective layer 240; and performing a second water-vapor annealing process on the second isolation fluid layer to form the second isolation film.

The second water-vapor annealing process may be performed with: a gas including oxygen, ozone, and water vapor; an annealing temperature of about 350° C. to about 750° C.

The second isolation layer 280 and the first isolation layer 230 in the first region X may form an isolation structure of the semiconductor device together. Since the protective layer 240 may be formed on the surfaces of the intrinsic fins 210 before forming the second isolation layer 280, a portion of the intrinsic fins 210 above the surface of the first isolation layer 230 may be covered by the protective layer 240. So the protective layer 240 may protect a portion of the intrinsic fins 210 close to the second region Y, and a damage on the portion of the intrinsic fins 210 close to the second region Y by the process for forming the second isolation layer 280 may be avoided. Then a case that the portion of the intrinsic fins 210 close to the second region Y has a small width may be avoided and the design needs may be satisfied.

The protective layer 240 may protect a portion of the intrinsic fins 210 close to the second region Y, and a large oxidation consumption on the portion of the intrinsic fins 210 close to the second region Y by the second water-vapor annealing process may be avoided. Then a case that the portion of the intrinsic fins 210 close to the second region Y has a small width may be avoided.

Referring to FIG. 11, the protective layer 240 may be removed after forming the second isolation layer 280.

The protective layer 240 may be removed by a wet etching process.

In one embodiment, the protective layer 240 may be made of $SiN_x$, and may be removed by the wet etching process using an etch solution of phosphate.

After removing the protective layer 240, the method may further include: forming gate structures across the intrinsic fins 210 to cover a portion of the top surfaces of the intrinsic fins 210 and a portion of the sidewalls of the intrinsic fins 210; and forming source/drain doped region in the intrinsic fins on sides of each gate structure.

Since the width of the portion of the intrinsic fins 210 close to the second region Y may be not too small, a volume of the source/drain doped regions in the portion of the intrinsic fins 210 close to the second region Y may be not too small. Correspondingly, strains on the channels by the source/drain doped regions in the portion of the intrinsic fins 210 close to the second region Y, and then the performance of the source/drain doped regions in the portion of the intrinsic fins 210 close to the second region Y, may be improved.

In one embodiment, the method may further include: forming an interlayer dielectric layer on the semiconductor substrate, on the intrinsic fins and on the source/drain doped regions, to cover sidewalls of the gate structures; removing the gate structures to form gate openings in the interlayer dielectric layer; forming a metal gate structure in each gate opening; forming through holes in the interlayer dielectric layer on sides of each metal gate structure to expose the source/drain doped regions.

When forming through holes in the interlayer dielectric layer on sides of each metal gate structure to expose the source/drain doped regions, a total loss of the source/drain doped regions in the portion of the intrinsic fins 210 close to the second region Y may be avoided since the volume of the source/drain doped regions in the portion of the intrinsic fins 210 close to the second region Y may be not too small.

The present disclosure also provides a semiconductor device formed by the above method. The semiconductor device may include: a semiconductor substrate 200 including a first region X and a second region Y, wherein the second region Y is adjacent to the first region X; intrinsic fins 210 protruding from the first region X of the semiconductor substrate 200; a first isolation layer 230 on the first region X of the semiconductor substrate 200 and covering a portion of sidewalls of the intrinsic fins 210; a second isolation layer 280 on the second region Y of the semiconductor substrate; and a protection layer 240 on the first region X of the semiconductor substrate and covering a portion of the intrinsic fins 210 above the first isolation layer 230.

In the present disclosure, after forming the first isolation layer, the dummy fins may be removed, and a portion of the first isolation layer on the second region of the semiconductor substrate may be removed when removing the dummy fins. The subsequently formed second isolation layer and the remaining first isolation layer on the first region may together form the isolation structure for the semiconductor device. Before forming the second isolation layer, the protection layer may be formed on the surfaces of the intrinsic fins, and a portion of the intrinsic fins above the first isolation layer may be covered by the protection layer. Correspondingly, the protection layer may protect the intrinsic fins close to the second region and the damage on the intrinsic fins close to the second region when forming the second isolation layer may be reduced or avoided. The intrinsic fins close to the second region with too small width may be avoided and the process need may be satisfied. The performance of the formed semiconductor structure may be improved.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A fabrication method of a semiconductor device, comprising:
    forming a semiconductor substrate including a first region and a second region adjacent to the first region;
    forming intrinsic fins protruding from the first region of the semiconductor substrate, and dummy fins protruding from the second region of the semiconductor substrate;
    forming a first isolation layer on the first region and on the second region of the semiconductor substrate, to cover a portion of sidewalls of the dummy fins and a portion of sidewalls of the intrinsic fins;
    forming a protection layer on surfaces of the intrinsic fins, to cover a portion of the intrinsic fins above a surface of the first isolation layer;
    removing the dummy fins and a portion of the first isolation layer, in the second region; and
    after removing the dummy fins and the portion of the first isolation layer in the second region, and after forming the protection layer, forming a second isolation layer on the second region of the semiconductor substrate.

2. The method according to claim 1, wherein:
forming the first isolation layer includes:
    forming a first isolation film on the semiconductor substrate, on the intrinsic fins and on the dummy fins;
    planarizing the first isolation film to remove a portion of the first isolation film on the dummy fins and on the intrinsic fins; and
    etching-back the first isolation film to form the first isolation layer.

3. The method according to claim 2, wherein:
the first isolation film is formed using a fluid chemical vapor deposition method; and
the first isolation film is formed by: forming a first isolation fluid layer on the semiconductor substrate, on the intrinsic fins and on the dummy fins; and performing a first water-vapor annealing process on the first isolation fluid layer to form the first isolation film.

4. The method according to claim 3, wherein:
the first water-vapor annealing process is performed with a gas including oxygen, ozone, and water vapor; and at an annealing temperature of about 350° C. to about 750° C.

5. The method according to claim 1, wherein:
the dummy fins and the portion of the first isolation layer in the second region are removed after forming the protection layer.

6. The method according to claim 5, wherein:
before removing the dummy fins and the portion of the first isolation layer in the second region, the protection layer further covers a portion of the dummy fins above the surface of the first isolation layer; and
a portion of the protection layer in the second region is removed when removing the dummy fins and the portion of the first isolation layer in the second region.

7. The method according to claim 5, wherein the dummy fins and the portion of the first isolation layer in the second region are removed by:
    forming a planarizing layer on the first isolation layer, on the dummy fins, on the intrinsic fins, and on the protection layer, wherein a whole top surface of the planarizing layer is higher than top surfaces of the dummy fins and of the intrinsic fins;

forming a bottom anti-reflective layer on the top surface of the planarizing layer;

forming a patterned photoresist layer on a top surface of the bottom anti-reflective layer;

etching the bottom anti-reflective layer, the planarizing layer, the dummy fins, and the portion of the first isolation layer in the second region, by using the patterned photoresist layer as a mask, to expose the surface of the semiconductor substrate in the second region; and removing the bottom anti-reflective layer, the planarizing layer, and the photoresist layer.

8. The method according to claim 1, wherein:

the protection layer is formed after forming the first isolation layer; and the protection layer covers a portion of the intrinsic fins above the top surface of the first isolation layer, and the first isolation layer in the first region.

9. The method according to claim 8, wherein:

the protection layer is formed after removing the dummy fins and the portion of the first isolation layer in the second region, or before removing the dummy fins and the portion of the first isolation layer in the second region.

10. The method according to claim 1, wherein:

the protection layer is formed before forming the first isolation layer;

the protection layer covers whole surfaces of the intrinsic fins; and after forming the first isolation layer, a portion of the protection layer is between the first isolation layer and the intrinsic fins.

11. The method according to claim 1, wherein:

the protection layer has a thickness of about 2 nm to about 10 nm.

12. The method according to claim 1, wherein the protection layer is made of SiN, SiCN, SiBN, TiN, TaN, or a combination thereof.

13. The method according to claim 1, wherein the second isolation layer is formed by:

forming a second isolation film on the second region of the semiconductor substrate and on the protection layer by a fluid chemical vapor deposition method; and etching-back the second isolation film to remove a portion of the second isolation film on the protection layer and to form the second isolation layer from the remaining second isolation film on the second region.

14. The method according to claim 13, wherein the second isolation film is formed by:

forming a second isolation fluid layer on the second region of the semiconductor substrate and on the protection layer; and performing a second water-vapor annealing process on the second isolation fluid layer to form the second isolation film.

15. The method according to claim 14, wherein the second water-vapor annealing process is performed with a gas including oxygen, ozone, and water vapor and at an annealing temperature of about 350° C. to about 750° C.

16. The method according to claim 1, wherein:

the first isolation layer is made of $SiO_2$; and the second isolation layer is made of $SiO_2$.

17. The method according to claim 16, further including:

after forming the second isolation layer, removing the protection layer.

18. The method according to claim 17, wherein:

the protection layer is removed by a wet etching process.

19. The method according to claim 17, after removing the protection layer, further including:

forming gate structures across the intrinsic fins to cover a portion of the top surfaces of the intrinsic fins and a portion of the sidewalls of the intrinsic fins;

forming source/drain doped regions in the intrinsic fins on sides of each gate structure;

forming an interlayer dielectric layer on the semiconductor substrate, on the intrinsic fins and on the source/drain doped regions, to cover sidewalls of the gate structures;

removing the gate structures to form gate openings in the interlayer dielectric layer;

forming a metal gate structure in each gate opening; and forming through holes in the interlayer dielectric layer on sides of each metal gate structure to expose the source/drain doped regions.

* * * * *